(12) United States Patent
Zin et al.

(10) Patent No.: US 11,721,731 B2
(45) Date of Patent: Aug. 8, 2023

(54) NONVOLATILE MEMORY HAVING MULTIPLE NARROW TIPS AT FLOATING GATE

(71) Applicant: GLOBALFOUNDRIES Singapore Pte. Ltd., Singapore (SG)

(72) Inventors: Zar Lwin Zin, Singapore (SG); Shyue Seng Tan, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/392,269

(22) Filed: Aug. 3, 2021

(65) Prior Publication Data
US 2023/0045062 A1 Feb. 9, 2023

(51) Int. Cl.
*H01L 29/423* (2006.01)
*G11C 8/14* (2006.01)
*H01L 29/08* (2006.01)
*H01L 21/28* (2006.01)
*H01L 29/788* (2006.01)
*H01L 29/66* (2006.01)
*G11C 16/14* (2006.01)
*H10B 41/10* (2023.01)

(52) U.S. Cl.
CPC ........ *H01L 29/42328* (2013.01); *G11C 8/14* (2013.01); *G11C 16/14* (2013.01); *H01L 29/0847* (2013.01); *H01L 29/40114* (2019.08); *H01L 29/66825* (2013.01); *H01L 29/788* (2013.01); *H10B 41/10* (2023.02)

(58) Field of Classification Search
CPC ........ H01L 29/42328; H01L 27/11519; H01L 29/0847; H01L 29/40114; H01L 29/66825; H01L 29/788; G11C 8/14; G11C 16/14

See application file for complete search history.

(56) References Cited

U.S. PATENT DOCUMENTS

| 6,875,660 B2 * | 4/2005 | Hung ........... H01L 27/115 438/257 |
| 2008/0268592 A1 * | 10/2008 | Park ........... H01L 29/7881 257/E29.302 |
| 2011/0127599 A1 | 6/2011 | Liu et al. | |

OTHER PUBLICATIONS

U.S. Appl. No. 17/026,436, Tan et al.
U.S. Appl. No. 17/355,257, Cai et al.

* cited by examiner

Primary Examiner — David Vu
(74) Attorney, Agent, or Firm — David Cain (57) ABSTRACT

A nonvolatile memory device is provided. The device comprises an active region, a floating gate over the active region and a wordline next to the floating gate. The floating gate has at least two narrow tips adjacent to the wordline and a portion of the floating gate between the narrow tips has a concave profile.

20 Claims, 7 Drawing Sheets

FIG. 6B ated to an embodiment of the disclosure.

NONVOLATILE MEMORY HAVING MULTIPLE NARROW TIPS AT FLOATING GATE

FIELD OF THE INVENTION

The disclosed embodiments relate generally to semiconductor memory devices, and more particularly, to a nonvolatile memory device with improved erase efficiency and compact cell size.

BACKGROUND

A nonvolatile memory device retains stored information even when power is removed. The stored information may be in the form of electric charges such as electrons. A nonvolatile memory device may include a floating gate to store charges, a control gate, an erase gate, a wordline, a source and a drain. The control gate may be arranged above the floating gate, and between the erase gate and the wordline. The source may be arranged below the erase gate. The drain may be arranged next to the wordline.

During an erase operation, a voltage may be applied to the erase gate and the charges stored in the floating gate may tunnel to the erase gate. A corner of the floating gate may be arranged next to the erase gate, presenting a sharp tip adjacent to the erase gate, thereby improving erase efficiency. However, the erase gate may also present a sharp tip next to the floating gate resulting in unwanted tunneling of charges from the erase gate to the floating gate, which is detrimental to the device operation. Thereby, there is a need for an improved nonvolatile memory device to overcome the challenges mentioned above.

SUMMARY

In an aspect of the present disclosure, a nonvolatile memory device is provided. The device comprises an active region, a floating gate over the active region and a wordline next to the floating gate. The floating gate has at least two narrow tips adjacent to the wordline and a portion of the floating gate between the narrow tips has a concave profile.

In another aspect of the present disclosure, a nonvolatile memory device is provided. The device comprises an active region, a first floating gate and a second floating gate over the active region, and a wordline between the first floating gate and the second floating gate. Each of the floating gates has at least two narrow tips next to the wordline and a concave portion of each of the floating gates between the narrow tips, and a portion of the wordline between the floating gates has a convex profile.

In yet another aspect of the present disclosure, a method of fabricating a nonvolatile memory device is provided. The method comprises forming an active region. A floating gate may be formed over the active region and a wordline may be formed next to the floating gate, whereby the floating gate has at least two narrow tips adjacent to the wordline and a portion of the floating gate between the narrow tips has a concave profile.

Numerous advantages may be provided in the embodiments described below. The embodiments provide a nonvolatile memory device with improved erase efficiency, reduced reverse tunneling from the wordline to the floating gate during the erase process, and a smaller cell size.

BRIEF DESCRIPTION OF THE DRAWINGS

The disclosed embodiments will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
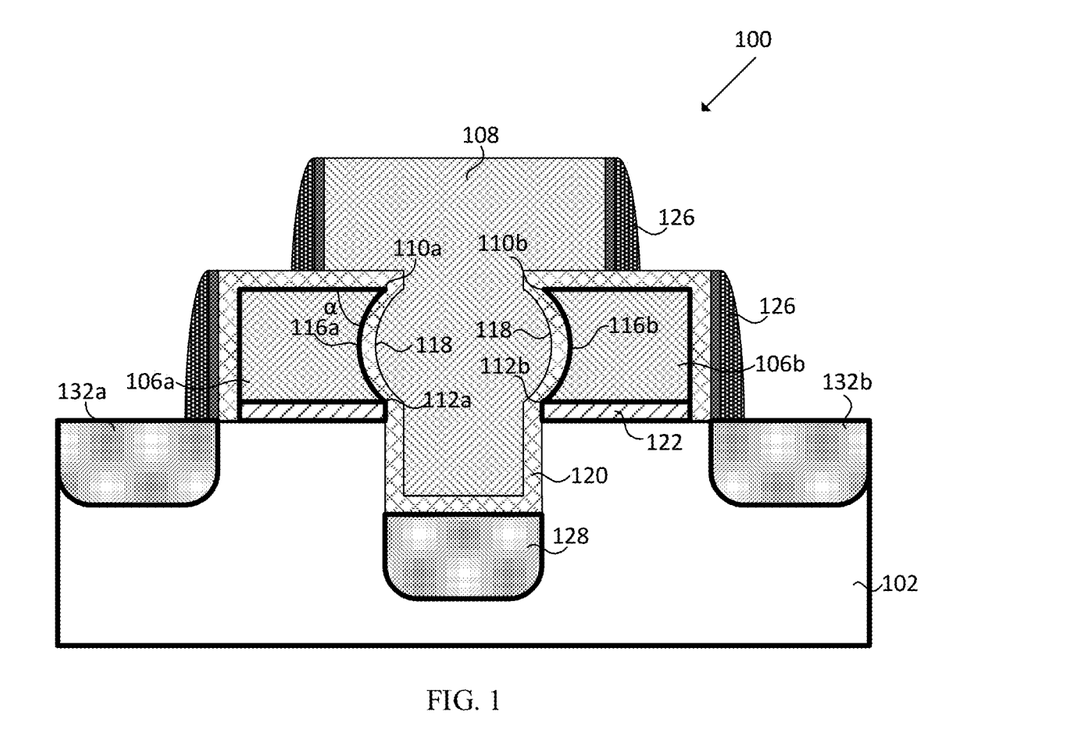
FIG. 1 shows a nonvolatile memory device, according to an embodiment of the disclosure.

FIG. 1 shows a nonvolatile memory device 100, according to an embodiment of the disclosure. Referring to FIG. 1, the nonvolatile memory device 100 may include an active region 102, floating gates 106a and 106b and a wordline 108. The floating gates 106a and 106b may be arranged above the active region 102, and the wordline 108 may be arranged between the floating gates 106a and 106b. Floating gate 106a may have at least two narrow tips, 110a and 112a, next to the wordline 108 and a concave portion 116a between the two narrow tips, 110a and 112a. Similarly, for floating gate 106b, a concave portion 116b may be arranged between two narrow tips 110b and 112b. The concave portion 116b and the narrow tips 110b and 112b may also be arranged next to the wordline 108. The term "tip" may refer to a place where at least two surfaces meet. In one embodiment, the tip may be an edge. For example, the tip 110a is formed where the top surface of the floating gate 106a meets the curved surface of the concave portion 116a. The tip 112a is formed where the bottom surface of the floating gate 106a meets the curved surface of the concave portion 116a. The term, "narrow" may refer to having an angle less than ninety degrees formed between at least two surfaces. For example, the narrow tip 110a may have an angle α of less than ninety degrees formed between the top surface of the floating gate 106a and the curved surface of the concave portion 116a. In one embodiment, the tips 110a, 110b, 112a and 112b may be sharp tips. In another embodiment, the tips 110a, 110b, 112a and 112b may be rounded due to processing. The concave portions 116a and 116b may have a concave surface. An object having a concave surface may refer to the surface being curved inwards. In one embodiment, the floating gate 106a may have a concave portion 116a next to the wordline 108 and narrow tips, 110a and 112a, at a top corner and a bottom corner, respectively, of the concave portion 116a. Similarly, for floating gate 106b, the concave portion 116b extends between narrow tips 110b and 112b. The concave portion 116b may be arranged next to an opposite side of the wordline 108 from the concave portion 116a.

A portion of the wordline 108 next to each of the floating gates, 106a or 106b, may have a convex profile. The term, "convex" may refer to having a surface that curves outwards. For example, the convex portion 118 of the wordline 108 next to each of the floating gates, 106a or 106b, may have a surface that curves outwards. The convex portions 118 of the wordline 108 may be spaced apart from each of the concave portions 116a and 116b. The convex portions 118 of the wordline 108 may be spaced apart from the narrow tips, 110a and 112a of floating gate 106a, and the narrow tips 110b and 112b of floating gate 106b. An upper portion of the wordline 108 may at least partially overlaps the top surface of each of the floating gates, 106a or 106b. A lower portion of the wordline 108 may extend below a top surface of the active region 102 and may be arranged in an upper portion of the active region 102. The upper portion of the wordline 108 may refer to the portion of the wordline 108 arranged above the convex portions 118. The lower portion of the wordline 108 may refer to the portion of the wordline 108 arranged below the convex portions 118. A source 128 may be arranged in a lower portion of the active region 102 and below the lower portion of the wordline 108. Drain regions, 132a or 132b, may be arranged in the upper portion of the active region 102, wherein the upper portion is above the lower portion of the active region 102. The drain region, 132a may be laterally displaced from the floating gate 106a. The source 128 may also be laterally displaced from the floating gate 106a and opposite to the drain 132a. Similarly, the drain region 132b may be laterally displaced from the floating gate 106b and the source 128 may be laterally displaced from the floating gate 106b and opposite to the drain 132b.

A dielectric layer 120 may be arranged between each of the floating gates, 106a or 106b, and the wordline 108. The dielectric layer 120 may have a substantially uniform thickness and may separate the concave portions 116a and 116b of each of the floating gates, 106a or 106b, respectively, from the convex portions 118 of the wordline 108. The dielectric layer 120 may also separate the narrow tips 110a and 112a of the floating gate 106a from the wordline 108. The dielectric layer 120 may also be arranged between the narrow tips 110b and 112b of the floating gate 106b and the wordline 108. The uniform dielectric layer 120 may provide good erase performance between the floating gates, 106a and 106b, and the wordline 108, facilitating charge transfer between the floating gates, 106a and 106b, and the wordline 108. The dielectric layer 120 may extend between the lower portion of the wordline 108 and the upper portion of the active region 102, and between a bottom surface of the wordline 108 and the source 128. In one embodiment, the dielectric layer 120 may extend over the top surface and a side surface of each of the floating gates, 106a or 106b.

In one embodiment, the floating gates 106a and 106b may have a non-uniform doping profile. For example, each narrow tip, 110a or 112a, may have a higher doping concentration compared to the concave portion 116a of the floating gate 106a. Similarly, the concave portion 116b of the floating gate 106b may have a lower doping concentration than the narrow tips 110b and 112b. In another embodiment, the floating gates 106a and 106b may be made of layers of different semiconductor materials. For example, the narrow tips 110a, 110b, 112a and 112b may be made of a suitable semiconductor material such as silicon while the concave portions 116a and 116b may be made of another semiconductor material such as silicon germanium. The narrow tips 110a, 110b, 112a and 112b may result in a more efficient erase process due to a corner enhanced electric field effect. The electric field at the narrow tips 110a, 110b, 112a and 112b is higher resulting in an increased transfer of charges from the floating gates 106a and 106b to the wordline 108. Reverse tunneling of charges from the wordline 108 to the floating gates 106a and 106b is minimized by the convex portions 118 of the wordline 108 next to the floating gates 106a and 106b.

A floating gate dielectric layer 122 may be arranged between each of the floating gates, 106a or 106b, and the active region 102. A spacer structure 126 may be arranged over a portion of the dielectric layer 120 adjacent to a side surface of each of the floating gates, 106a or 106b. The spacer structure 126 may also be arranged over a side surface of the upper portion of the wordline 108.

Figure 2A:
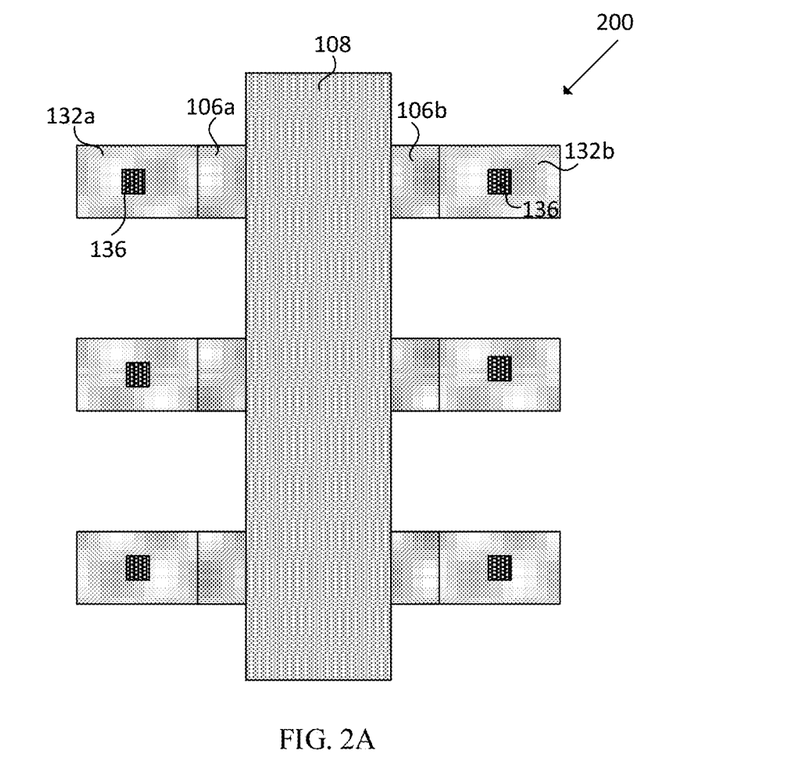
FIG. 2A shows a top view of a nonvolatile memory device array, according to an embodiment of the disclosure.

FIG. 2A shows a top view of a nonvolatile memory device array 200, according to an embodiment of the disclosure. Referring to FIG. 2A, the wordline 108 may extend over a plurality of nonvolatile memory devices. Each nonvolatile memory device may have a floating gate 106a or 106b adjacent to and at least partially covered by the wordline 108. For example, the floating gate 106a may be arranged at least partially below the wordline 108 and next to the drain 132a. A contact 136 may be arranged above the drain 132a. The floating gate 106b may be arranged at least partially below the wordline 108 and spaced apart from the floating gate 106a. A drain 132b may be arranged next to the floating gate 106b. An isolation region may separate the floating gates 106a and 106b from neighboring devices. The isolation region is not shown in this top view for simplicity.

Figure 2B:
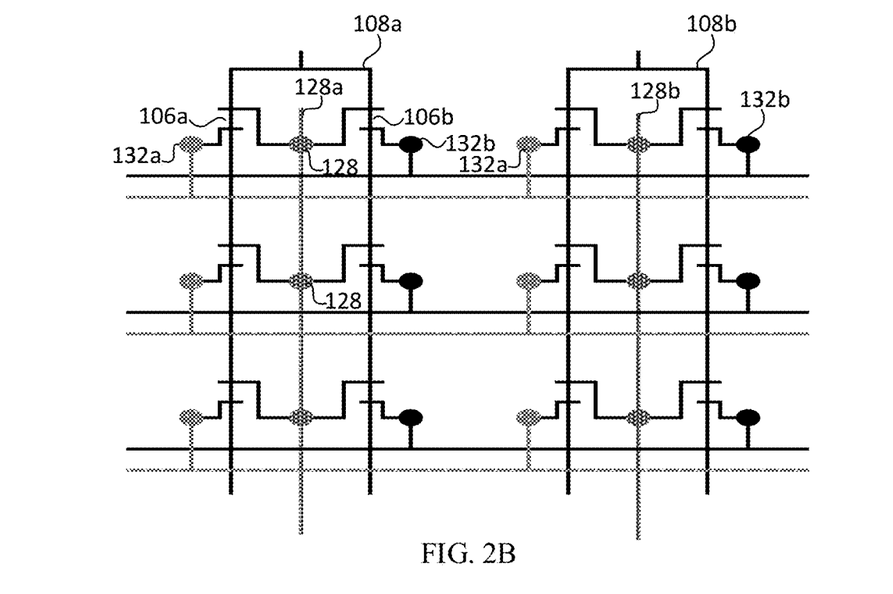
FIG. 2B shows a schematic view of a nonvolatile memory device circuit, according to an embodiment of the disclosure.

FIG. 2B shows a schematic view of a nonvolatile memory device circuit, according to an embodiment of the disclosure. Referring to FIG. 2B, a sourceline 128a may connect a source 128 of each of the nonvolatile memory devices arranged in the same column. A drain 132a of each of the nonvolatile memory devices arranged in the same row may be electrically connected. A drain 132b of each of the nonvolatile memory devices arranged in the same row may also be electrically connected. A wordline 108a may be shared by adjacent floating gates, 106a or 106b, of the nonvolatile memory devices arranged in the same column.

Table 1 shows an exemplary biasing condition of the nonvolatile memory device circuit shown in FIG. 2B. Referring to FIG. 2B, during a program operation, approximately 8V may be applied to a drain of a selected nonvolatile memory device to be programmed. For example, 8V may be applied to the drain 132a. 0V may be applied to a drain of an unselected nonvolatile memory device. For example, 0V may be applied to the drain 132b. Approximately 1.5V may be applied to the wordline 108a and the wordline 108b may be grounded. Approximately 1 µA may be applied to a source 128 through the sourceline 128a while 2.5V may be applied to the sourceline 128b. A pulse duration for programming may be approximately 20 µs. The biasing conditions may create a high electric field in a channel region between the source 128 connected to the sourceline 128a and the drain 132a, resulting in electron injection to the floating gate 106a.

During an erase operation, approximately 12V may be applied to a selected wordline. For example, 12V may be applied to the wordline 108a while the wordline 108b may be grounded. The drains 132a and 132b, and the sourcelines 128a and 128b, may also be grounded. A pulse duration for erasing may be approximately 2 ms. The biasing conditions create a high electric field between the wordline 108a and the floating gates 106a and 106b below the wordline 108a, causing charges stored in the floating gates 106a and 106b to tunnel to the wordline 108a. For example, the charges may tunnel from the narrow tips 110a, 110b, 112a and 112b (not shown) of the floating gates 106a and 106b to the wordline 108a. The floating gates 106a and 106b below the wordline 108a are erased simultaneously.

Figure 3A:
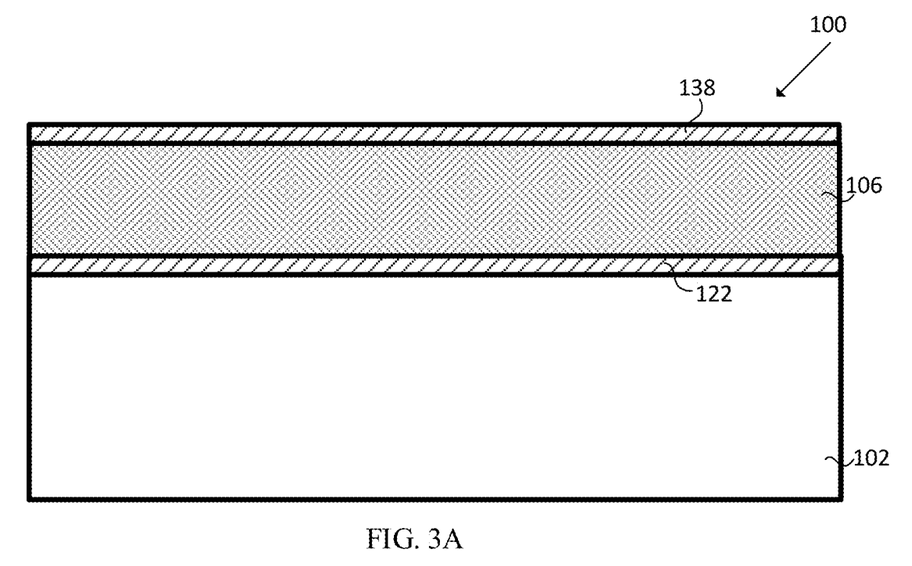
FIGS. 3A to 3D show a fabrication process flow for the nonvolatile memory device shown in FIG. 1, according to some embodiments of the disclosure.

During a read operation, approximately 0.8V may be applied to a drain of a selected nonvolatile memory device. For example, 0.8V may be applied to the drain 132a while the drain 132b may be grounded. Approximately 2.5V may be applied to the wordline 108a while the wordline 108b and the sourcelines 128a and 128b may be grounded. A current may flow across the channel region between the drain 132a and the source 128 connected to the sourceline 128a, depending on the charges stored in the floating gate 106a.

center portion of the floating gate layer 106 and a higher dose of dopants in the upper and lower portions followed by activation annealing. In another embodiment, the floating gate layer 106 may be made of alternating layers of silicon and silicon germanium. For example, the center portion of the floating gate layer 106 may be made of silicon germanium, while the upper portion and the lower portion of the floating gate layer 106 may be made of silicon. In one embodiment, the floating gate layer 106 may be doped n-type. A pad oxide layer 138 may be formed at the top surface of the floating gate layer 106. The pad oxide layer 138 may be made of silicon dioxide or any other suitable dielectric material.

Figure 3B:
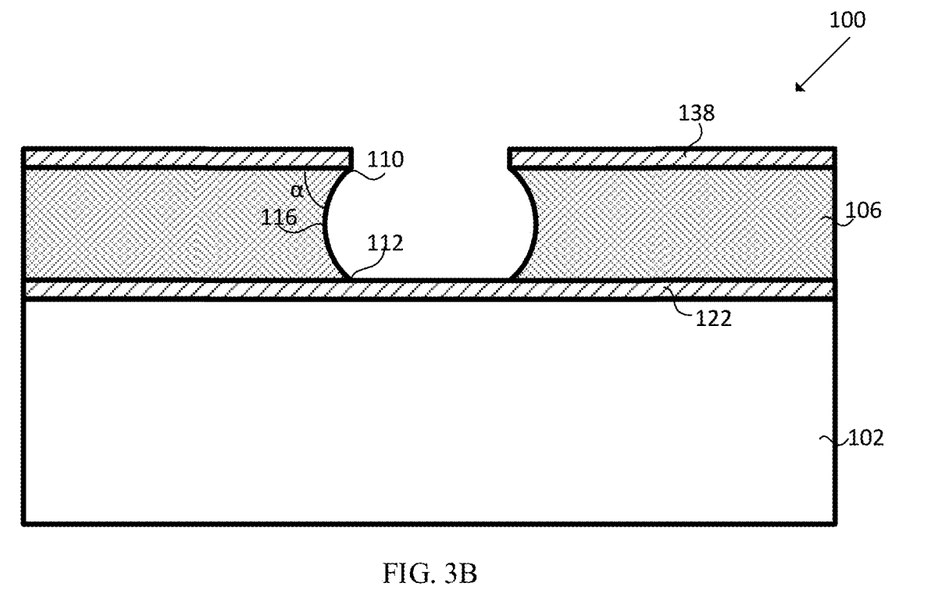

FIG. 3B shows a partially completed nonvolatile memory device 100 after patterning the pad oxide layer 138 and the floating gate layer 106, according to an embodiment of the disclosure. Referring to FIG. 3B, the pad oxide layer 138 and the floating gate layer 106 may be patterned by a wet etch or dry etch process. The patterning process may separate the floating gate layer 106 into two portions and may form at least two narrow tips 110 and 112 at the top corner and the bottom corner of each portion of the floating gate layer 106. The narrow tips 110 and 112 may have an angle α of less than ninety degrees. A portion 116 of the floating gate layer 106 between the two narrow tips 110 and 112 may have a concave profile, having a surface that curves inwards. In one embodiment, the formation of the narrow tips 110 and 112 and the concave portion 116 of the floating gate layer

TABLE 1

|  | Drain | | Wordline | | Sourceline | | Pulse |
| --- | --- | --- | --- | --- | --- | --- | --- |
|  | Selected | Unselected | Selected | Unselected | Selected | Unselected | duration |
| Program | 8 V | 0 V | 1.5 V | 0 V | 1 µA | 2.5 V | 20 µs |
| Erase | 0 V | 0 V | 12 V | 0 V | 0 V | 0 V | <2 ms |
| Read | 0.8 V | 0 V | 2.5 V | 0 V | 0 V | 0 V |  |

FIGS. 3A to 3D show a fabrication process flow for the nonvolatile memory device 100 shown in FIG. 1, according to some embodiments of the disclosure. FIG. 3A shows a partially completed nonvolatile memory device 100 after formation of a floating gate dielectric layer 122, a floating gate layer 106, and a pad oxide layer 138, according to an embodiment of the disclosure. Referring to FIG. 3A, a substrate may be provided and an active region 102 may be formed in the substrate. The substrate may be made of silicon or any other suitable semiconductor material. The active region 102 may be a p-well. A floating gate dielectric layer 122 may be formed over a top surface of the active region 102 by thermal oxidation or by a suitable deposition process. The floating gate dielectric layer 122 may be made of silicon dioxide or any other suitable dielectric material. The floating gate layer 106 may be deposited over the floating gate dielectric layer 122 by a suitable deposition process, for example, chemical vapor deposition (CVD), atomic layer deposition (ALD), physical vapor deposition (PVD), or any other suitable deposition processes. In one embodiment, the floating gate layer 106 may be made of polysilicon. In a preferred embodiment, the floating gate layer 106 may have a non-uniform doping profile. For example, a center portion of the floating gate layer 106 may have a lower doping concentration than an upper portion above the center and a lower portion below the upper and center portions. The formation of the non-uniform doping profile may be by implanting a low dose of dopants in the 106 may be due to the lower doped center portion of the floating gate layer 106 having a higher etching rate as compared to the highly doped upper and lower portions of the floating gate layer 106. In another embodiment, the formation of the narrow tips 110 and 112 and the concave portion 116 of the floating gate layer 106 may be due to the higher etching rate of silicon germanium at the center portion of the floating gate layer 106 as compared to silicon at the upper and lower portions of the floating gate layer 106.

Figure 3C:
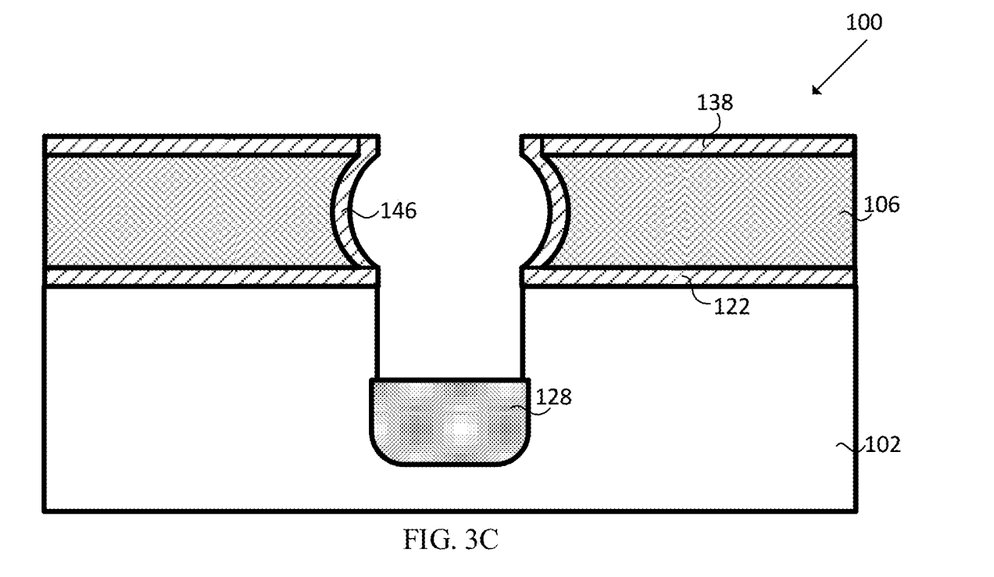

FIG. 3C shows a partially completed nonvolatile memory device 100 after formation of a sacrificial oxide layer 146, patterning the floating gate dielectric layer 122 and the active region 102, and formation of the source 128, according to an embodiment of the disclosure. Referring to FIG. 3C, the sacrificial oxide layer 146 may be formed over a side surface of each portion of the floating gate layer 106. A wet etch or dry etch process may be used to remove the floating gate dielectric layer 122 and an upper portion of the active region 102 laterally displaced from the floating gate layer 106 portions. The etching process may leave behind a lower portion of the active region 102 and the source 128 may be formed in the lower portion of the active region 102. The formation of the source 128 may include doping the lower portion of the active region 102 with a suitable n-type dopant, for example, arsenic, phosphorus, or any other suitable n-type dopant.

Figure 3D:
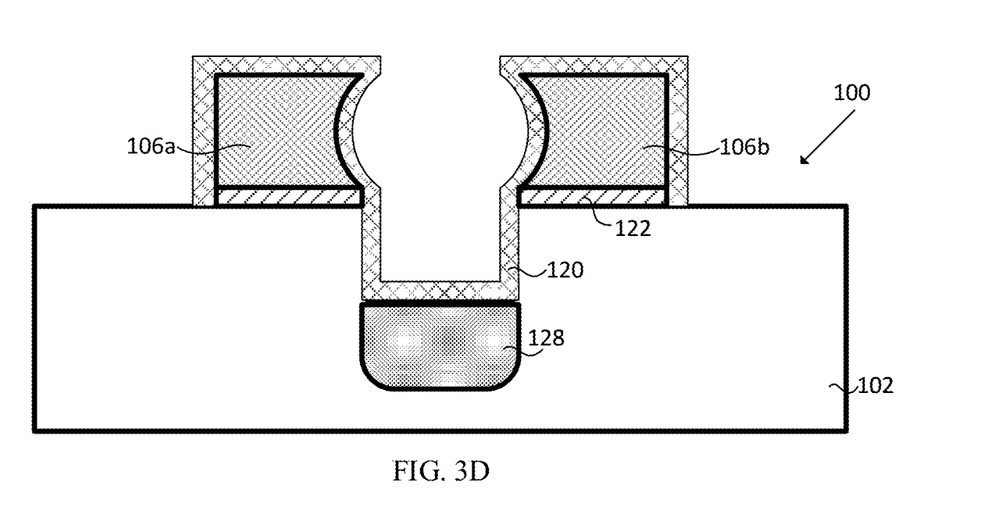

FIG. 3D shows a partially completed nonvolatile memory device 100 after formation of the floating gates, 106a and 106b, respectively, and the dielectric layer 120, according to an embodiment of the disclosure. Referring to FIG. 3D, a wet etch or dry etch process may be used to pattern the floating gate layer 106 portions to form the floating gates, 106a and 106b, respectively. The sacrificial oxide layer 146 may be removed by a wet etch, dry etch or any other suitable removal process. The dielectric layer 120 may be deposited over the floating gates, 106a and 106b, respectively, side surfaces of the upper portion of the active region 120 laterally displaced from the floating gates, 106a and 106b, respectively, and over the source 128. The dielectric layer 120 may be made of silicon dioxide, hafnium silicon oxynitride, or any other suitable dielectric material.

The process continues to form the nonvolatile memory device 100 shown in FIG. 1. Referring to FIG. 1, the wordline 108 may be formed over the floating gates, 106a and 106b, respectively, and over the source 128. The formation of the wordline 108 may include depositing a layer of doped polysilicon or any other suitable conductive material followed by patterning the doped polysilicon layer. In one embodiment, the polysilicon layer may be doped n-type. Spacer structures 126 may be formed over side surfaces of the wordline 108 and the floating gates, 106a and 106b, respectively. The formation of the spacer structures 126 may include depositing a suitable dielectric layer, for example, silicon dioxide, silicon nitride, silicon oxynitride, or any other suitable dielectric layer followed by anisotropic etching. The term anisotropic etching may refer to an etching process that is directional in nature. The first and second drains, 132a and 132b, respectively, may be formed in the upper portions of the active region 102 and laterally displaced from the floating gates, 106a and 106b, respectively. The formation of the first and second drains, 132a and 132b, respectively, may include doping the upper portions of the active region 102 with a suitable n-type dopant, for example, arsenic, phosphorus or any other suitable n-type dopant.

Figure 4A:
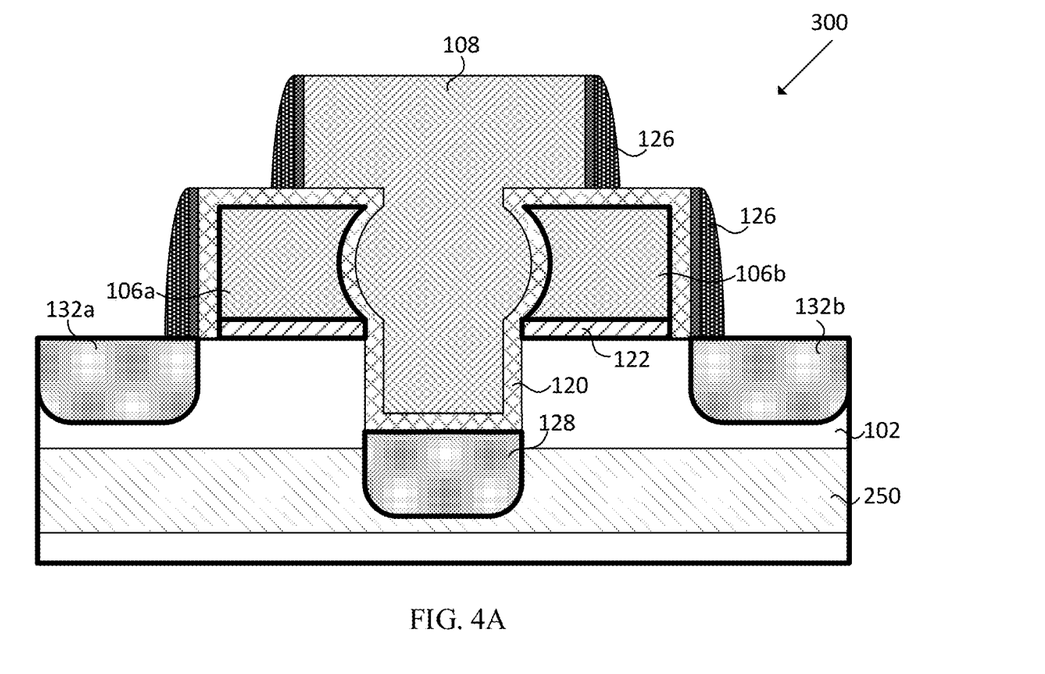
FIG. 4A shows a nonvolatile memory device, according to another embodiment of the disclosure.

FIG. 4A shows a nonvolatile memory device 300, according to another embodiment of the disclosure. Like reference numerals in FIG. 1 refer to like features in FIG. 4A. In contrast to the nonvolatile memory device 100 shown in FIG. 1, the nonvolatile memory device 300 may include a buried sourceline 250 in the lower portion of the active region 102 extending laterally from the source 128 to below the drains 132a and 132b. The sourceline 250 may be spaced from the drains 132a and 132b. The source 128 may be at least partially arranged in the sourceline 250 and electrically connected to the sourceline 250. The buried sourceline 250 may be an n+-doped region and may electrically connect to a source 128 of a neighboring nonvolatile memory device 300 (not shown).

Figure 4B:
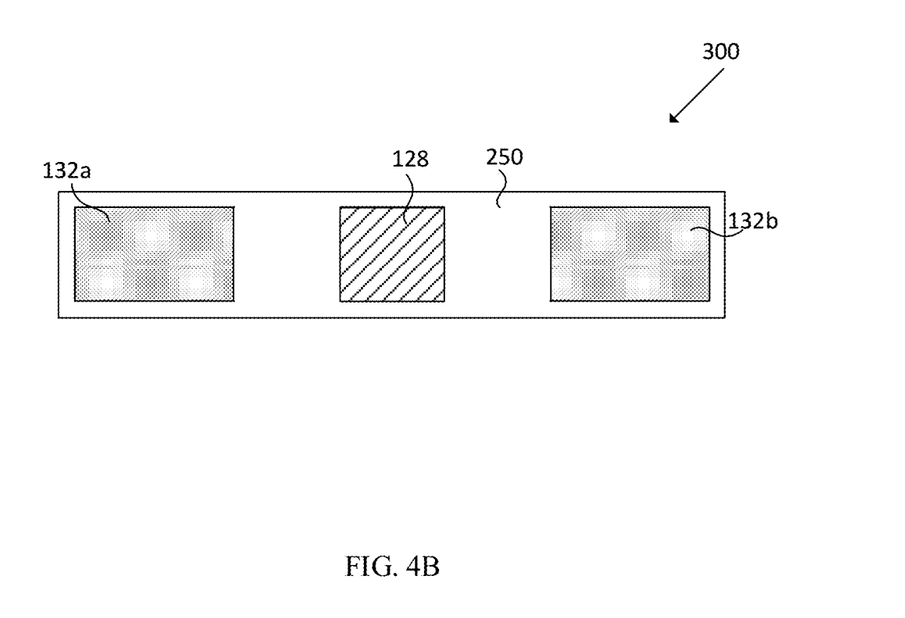
FIG. 4B shows a layout schematic of the buried source-line, the source and the drains of the nonvolatile memory device shown in FIG. 4A.

FIG. 4B shows a layout schematic of the buried sourceline 250, the source 128 and the drains 132a and 132b of the nonvolatile memory device 300. Referring to FIG. 4B, the source 128 may be arranged in the sourceline 250. The sourceline 250 may extend from the source 128 to beyond the drains 132a and 132b. Although not shown, the sourceline 250 may electrically connect to a sourceline of a neighboring nonvolatile memory device. The buried sourceline 250 may result in a smaller cell size as it allows reduction of metal and via routing resources. The buried sourceline 250 may be fabricated by doping the active region 102 with a suitable n-type dopant, for example, arsenic, phosphorus, or any other suitable n-type dopant.

Figure 5:
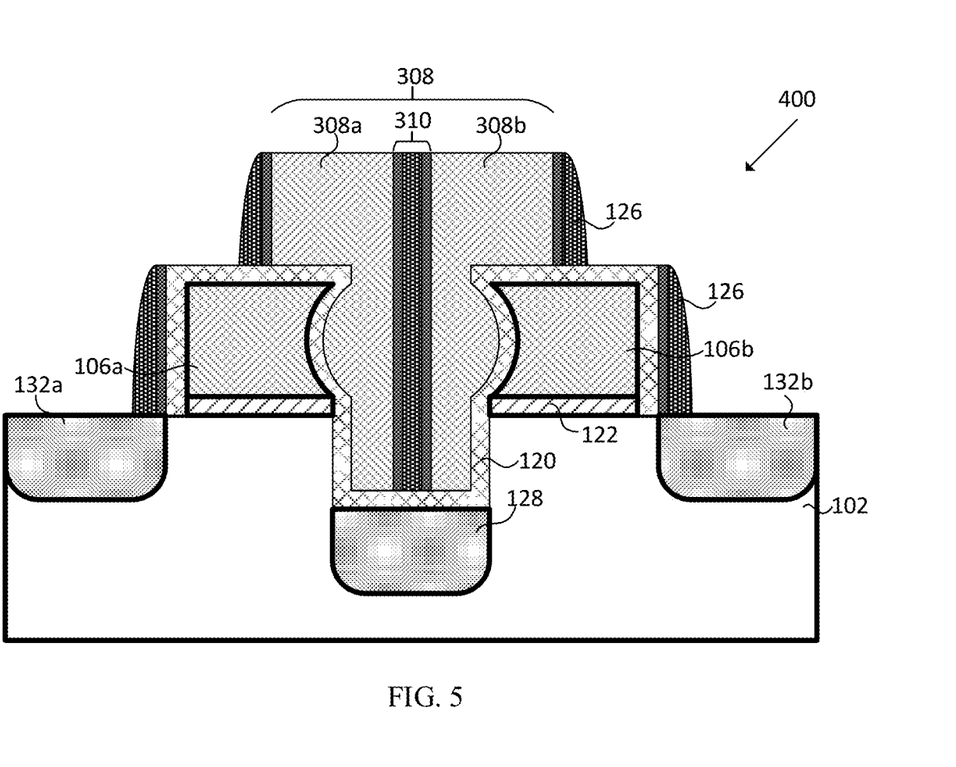
FIG. 5 shows a nonvolatile memory device, according to yet another embodiment of the disclosure.

FIG. 5 shows a nonvolatile memory device 400, according to yet another embodiment of the disclosure. Like reference numerals in FIG. 1 refer to like features in FIG. 5. In contrast to the nonvolatile memory device 100 shown in FIG. 1, the nonvolatile memory device 400 may include an insulating layer 310 extending through a center portion of a wordline 308 and separating the wordline 308 to a wordline 308a and a wordline 308b. The insulating layer 310 may be made of silicon dioxide, silicon nitride, hafnium silicon oxynitride, or any other suitable dielectric material. The wordline 308a may be arranged next to the floating gate 106a. The wordline 308b may be arranged next to the floating gate 106b. The nonvolatile memory device 400 provides ease of operation as the wordline 308a and the wordline 308b are electrically isolated from each other. For example, the wordline 308a may affect charges stored in the floating gate 106a but is electrically isolated from the floating gate 106b.

A fabrication process flow for the nonvolatile memory device 400 may be like the fabrication process flow for the nonvolatile memory device 100 shown in FIGS. 3A to 3D. A doped polysilicon layer may be deposited over the floating gate 106a and the floating gate 106b. The doped polysilicon layer may be patterned by a wet etch or dry etch process to form the wordline 308a and the wordline 308b with an opening between the wordline 308a and the wordline 308b. A layer of suitable dielectric material, for example silicon dioxide, silicon nitride, or any other suitable dielectric material may be deposited in the opening, over side surfaces of the wordlines 308a and 308b and the floating gates 106a and 106b. An anisotropic etching process may be used to remove the dielectric material from upper surfaces of the wordlines 308a and 308b, the floating gates 106a and 106b and the substrate 102. The etching process may leave behind the dielectric layer in the opening between the wordlines 308a and 308b to form the insulating layer 310. The etching process may also leave behind the dielectric layer over side surfaces of the wordlines 308a and 308b and floating gates 106a and 106b, thereby forming the spacers 126.

Figure 6A:
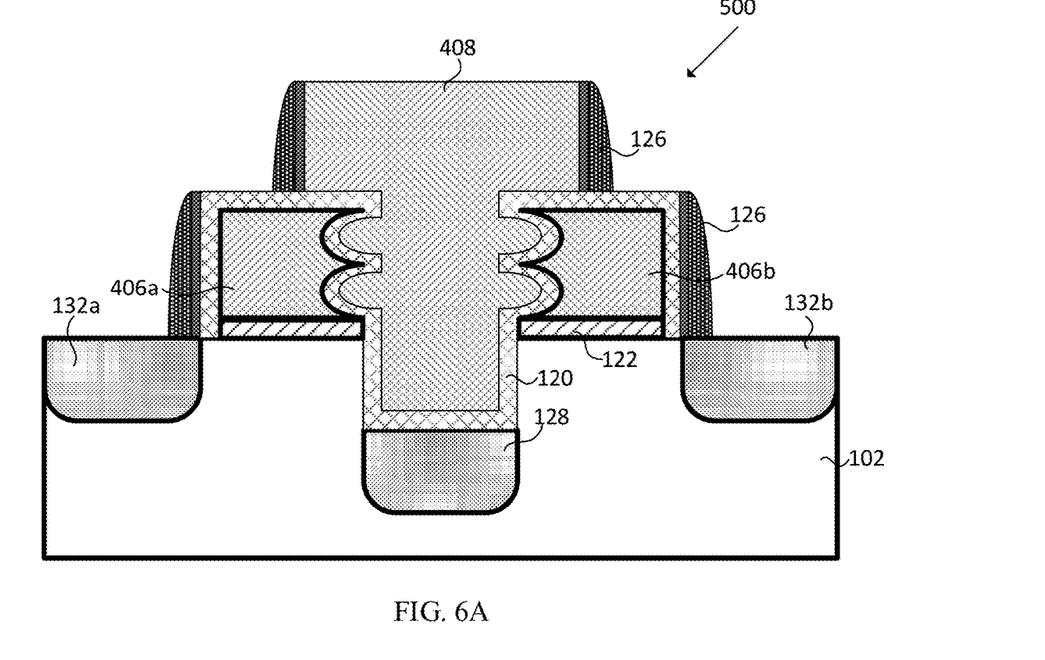
FIG. 6A shows a nonvolatile memory device, according to further embodiments of the disclosure.

FIG. 6A shows a nonvolatile memory device 500, according to further embodiments of the disclosure. Like reference numerals in FIG. 1 refer to like features in FIG. 6A. In contrast to the nonvolatile memory device 100 shown in FIG. 1, the nonvolatile memory device 500 includes a floating gate 406a and a floating gate 406b having a plurality of narrow tips next to a wordline 408. In one embodiment, the narrow tips may have a higher doping concentration than the concave portions of the floating gates 406a and 406b between the narrow tips. In an alternative embodiment, the narrow tips may be made of a different semiconductor material than the concave portions of the floating gates 406a and 406b. For example, the narrow tips may be made of silicon and the concave portions of the floating gates 406a and 406b may be made of silicon germanium.

Figure 6B:
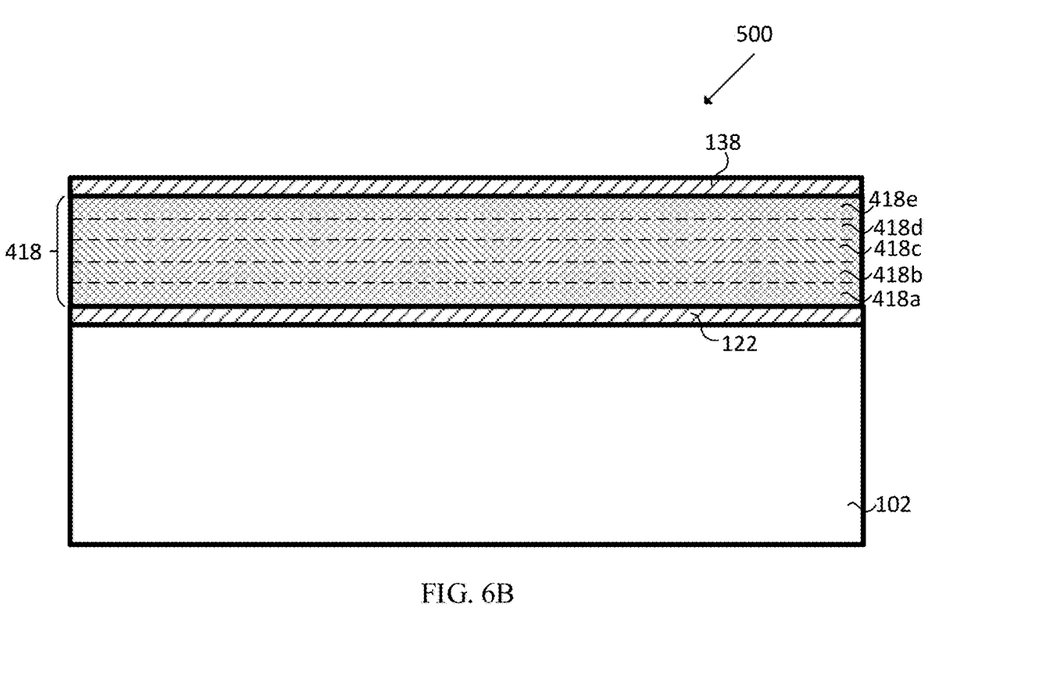
FIG. 6B shows a partially completed nonvolatile memory device after formation of a floating gate dielectric layer, a floating gate layer, and a pad oxide layer, according to an embodiment of the disclosure.

FIG. 6B shows a partially completed nonvolatile memory device 500 after formation of a floating gate dielectric layer 122, a floating gate layer 418, and a pad oxide layer 138, according to an embodiment of the disclosure. Referring to FIG. 6B, in one embodiment, the nonvolatile memory device 500 may be fabricated by forming a floating gate layer 418 having a non-uniform doping profile over the active region 102. The floating gate layer 418 may be made of polysilicon. For example, the floating gate layer 418 may have five portions having different doping concentrations. The five portions are indicated by dashed lines. A first portion 418a may have a high doping concentration and a second portion 418b over the first portion 418a may have a lower doping concentration than the first portion 418a. A third portion 418c over the second portion 418b may have a higher doping concentration than the second portion 418b. A fourth portion 418d over the third portion 418c may have a lower doping concentration than the third portion 418c. A fifth portion 418e over the fourth portion 418d may have a higher doping concentration than the fourth portion 418d. The floating gate layer 418 may subsequently be patterned to form the floating gates 406a and 406b having the plurality of narrow tips, like the fabrication process flow shown in FIG. 3B.

In an alternative embodiment, the nonvolatile memory device 500 may be fabricated by forming a floating gate layer 418 made of alternating layers of different semiconductor materials over the active region 102. Referring to FIG. 6B, for example, the first portion 418a may be made of silicon and the second portion 418b may be made of silicon germanium. The third portion 418c may be made of silicon and the fourth portion 418d may be made of silicon germanium. The fifth portion 418e may be made of silicon. The floating gate layer 418 may subsequently be patterned to form the floating gates 406a and 406b having the plurality of narrow tips, like the fabrication process shown in FIG. 3B. Thereafter, the fabrication process flow may be like the flow shown for the nonvolatile memory device 100.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
   an active region in a substrate;
   a floating gate over the active region; and
   a wordline next to the floating gate, wherein the floating gate has at least two narrow tips adjacent to the wordline and a concave portion between the narrow tips, and a lower portion of the wordline is arranged in an upper portion of the active region in the substrate.

2. The nonvolatile memory device of claim 1, wherein a portion of the wordline next to the concave portion of the floating gate has a convex profile.

3. The nonvolatile memory device of claim 2, wherein the portion of the wordline is laterally displaced from the concave portion of the floating gate.

4. The nonvolatile memory device of claim 1, wherein an upper portion of the wordline at least partially overlaps a top surface of the floating gate.

5. The nonvolatile memory device of claim 1, further comprising:
   a source arranged in a lower portion of the active region, wherein the source underlaps the wordline.

6. The nonvolatile memory device of claim 5, further comprising:
   a dielectric layer between the floating gate and the wordline, wherein the dielectric layer has a substantially uniform thickness.

7. The nonvolatile memory device of claim 6, wherein the dielectric layer extends into the substrate between the wordline and the active region, and between the wordline and the source.

8. The nonvolatile memory device of claim 5, further comprising:
   a drain in the active region laterally displaced from the floating gate; and
   a doped region in the active region connected to the source, wherein the doped region extends laterally below and is spaced from the drain.

9. The nonvolatile memory device of claim 8, wherein the source is arranged at least partially in the doped region.

10. The nonvolatile memory device of claim 1, wherein the narrow tips have a higher doping concentration than the concave portion of the floating gate between the narrow tips.

11. The nonvolatile memory device of claim 1, wherein the narrow tips are made of silicon and the concave portion of the floating gate is made of silicon germanium.

12. The nonvolatile memory device of claim 1, wherein each of the narrow tips is at a corner of the floating gate.

13. The nonvolatile memory device of claim 1, further comprising:
   an insulating layer extending through a center portion of the wordline.

14. A nonvolatile memory device comprising:
   an active region;
   a first floating gate over the active region;
   a second floating gate over the active region; and
   a wordline between the first floating gate and the second floating gate, wherein the first floating gate and the second floating gate each has at least two narrow tips next to the wordline and a concave portion between the narrow tips, the narrow tips having a higher doping concentration than the concave portion between the narrow tips, and a portion of the wordline between the first floating gate and the second floating gate has a convex profile.

15. The nonvolatile memory device of claim 14, wherein the portion of the wordline is laterally displaced from the concave portions of the first floating gate and the second floating gate.

16. The nonvolatile memory device of claim 14, further comprising:
an insulating layer extending through a center portion of the wordline and between the first floating gate and the second floating gate.

17. A method of fabricating a nonvolatile memory device comprising:
forming an active region in a substrate;
forming a floating gate over the active region; and
forming a wordline next to the floating gate, wherein the floating gate has at least two narrow tips adjacent to the wordline and a portion of the floating gate between the narrow tips has a concave profile, and a lower portion of the wordline is arranged in an upper portion of the active region in the substrate.

18. The method of claim 17, wherein an upper portion and a lower portion of the floating gate is made of a different semiconductor material from a center portion of the floating gate.

19. A method of fabricating a nonvolatile memory device comprising:
forming an active region;
forming a floating gate over the active region; and
forming a wordline next to the floating gate, wherein the floating gate has at least two narrow tips adjacent to the wordline and a portion of the floating gate between the narrow tips has a concave profile, wherein forming the floating gate further comprises:
depositing the floating gate over the active region, wherein the floating gate has a low dopant concentration in a center portion of the floating gate and a high dopant concentration in an upper portion and a lower portion of the floating gate; and
patterning the floating gate to form the at least two narrow tips at the upper portion and the lower portion of the floating gate.

20. The method of claim 19, further comprising:
patterning the active region laterally displaced from the floating gate to remove an upper portion of the active region and leave behind a lower portion of the active region;
doping the lower portion of the active region to form a source; and
forming the wordline next to the floating gate and over the source, wherein a portion of the wordline next to the floating gate has a convex profile.

* * * * *